United States Patent
Barth, Jr. et al.

(10) Patent No.: US 6,272,054 B1
(45) Date of Patent: Aug. 7, 2001

(54) TWIN-CELL MEMORY ARCHITECTURE WITH SHIELDED BITLINES FOR EMBEDDED MEMORY APPLICATIONS

(75) Inventors: John E. Barth, Jr., Williston; John Atkinson Fifield, Underhill, both of VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/702,336

(22) Filed: Oct. 31, 2000

(51) Int. Cl.[7] .................................................. G11C 16/04
(52) U.S. Cl. .................... 365/189.06; 365/203; 365/205; 365/207
(58) Field of Search .............................. 365/189.06, 205, 365/207, 203, 214, 63, 51, 206

(56) References Cited

U.S. PATENT DOCUMENTS

| 4,872,142 | 10/1989 | Hannai . |
|---|---|---|
| 4,980,864 | 12/1990 | Fukuhama et al. . |
| 5,010,524 | 4/1991 | Fifield et al. . |
| 5,045,899 | 9/1991 | Arimoto . |
| 5,732,010 | 3/1998 | Takashima et al. . |
| 5,764,562 | 6/1998 | Hamamoto . |
| 5,838,038 | 11/1998 | Takashima et al. . |
| 5,949,720 | * 9/1999 | Brady .............................. 365/189.06 |

FOREIGN PATENT DOCUMENTS

| 2-231759A | 9/1990 | (JP) . |
|---|---|---|
| 404132074A | * 5/1992 | (JP) .............................. G11C/11/401 |

* cited by examiner

Primary Examiner—David Nelms
Assistant Examiner—David Lam
(74) Attorney, Agent, or Firm—Scully, Scott, Murphy & Presser; Steven Capella, Esq.

(57) ABSTRACT

A twin cell memory array which includes shielded bitlines is provided. The twin cell memory array includes a plurality of bitlines arranged in one direction in parallel with each other, with every other bitline constituting a bitline pair; a plurality of sense amplifiers being arranged in a line, wherein each sense amplifier is interconnected to two adjacent bitline pairs; a plurality of wordlines arranged in a direction intersecting said plurality of bitlines, wherein a single wordline is coupled to every other bitline; and isolation means located on said plurality of bitlines, said isolation means being arranged such that when every other bitline of said plurality of bitlines is being sensed, the adjacent bitlines of said plurality of bitlines are held at a predetermined potential by a clamping means.

9 Claims, 2 Drawing Sheets

TWIN-CELL MEMORY ARCHITECTURE WITH SHIELDED BITLINES FOR EMBEDDED MEMORY APPLICATIONS

FIELD OF THE INVENTION

The present invention relates to random access memory arrays, and more particular to a twin-cell, folded bitline memory architecture in which bitline crosstalk is essentially eliminated by combining a twin-cell, folded bitline layout with bitline shielding so that every other bitline of the array in sensed, while holding unselected bitlines which are adjacent to the sensed bitlines at a predetermined voltage level. The inventive architecture provides increased signal efficiency and improved test efficiency since the effects of data patterns are reduced.

BACKGROUND OF THE INVENTION

In the field of semiconductor memory devices such as DRAMs (dynamic random access memories) and EBBs (embedded memories), it is well known to use an array layout in which each bitline of the array is coupled to a sense amplifier. Such a layout is shown, for example, in FIG. 1. Specifically, FIG. 1 is a schematic diagram of a prior art single-cell, folded bitline memory layout which includes memory cells 10, horizontally arranged wordlines WL1, WL2, WL3, WL4 and etc, vertically arranged bitlines BL1, BL2, BL3, BL4 and etc, transistors 12, and sense amplifiers, SA1 and SA2.

In the prior art single-cell, folded bitline memory layout shown in FIG. 1, each neighboring bitline, which forms a bitline pair, is coupled to a single sense amplifier. For example, BL1 and BL2 are both directly coupled to sense amplifier, SA1, whereas BL3 and BL4 are both directly coupled to sense amplifier SA2. Thus, each sense amplifier is capable of sensing only two bitlines in the single-cell arrangement shown in FIG. 1.

In a read operation, the bitlines are electrically connected to the sense amplifier through transistors 12 and are subjected to amplification. Through amplification, each pair of bitlines, which have been precharged to predetermined levels, are changed to different potentials. Particularly, one of each pair of bitlines is discharged to the ground potential. Since the bitlines are arranged in parallel, a stray capacitance is present between two adjacent bitlines. Therefore, a change in potential at one bitline will affect the adjacent bitline as noise through the stray capacitance.

Twin-cell, folded bitline memory arrays which generate twice as much signal as a single-cell memory array are also known. A typical twin-cell, folded bitline memory array is shown in FIG. 2. Specifically, the twin-cell memory array of FIG. 2 comprises memory cells 10, horizontally arranged wordlines $WL_A$, $WL_B$, and etc, and vertically arranged bitlines BL1, BL2, BL3, BL4 and etc, transistors 12 and sense amplifiers, SA1 and SA2. In the twin-cell memory layout shown in FIG. 2, $WL_A$ includes a pair of wordlines, e.g., WL1 and WL2 that are shorted together, whereas $WL_B$ denotes another pair of wordlines, e.g., WL3 and WL4, that are shorted together. In the prior art twin-cell memory structure of FIG. 2, it is required that a pair of wordlines, i.e., WL1+WL2 or WL3+WL4, be activated at the same time.

As in the case with single-cell layouts, prior art twin-cell layouts of the type illustrated in FIG. 2 exhibit bitline line-to-line coupling which causes noise problems. In view of the drawbacks with conventional single- and twin-cell, folded bitline memory layouts, there is a need for a new and improved twin-cell, folded bitline memory design in which bitline crosstalk caused by bitline line-to-line coupling has been essentially eliminated.

SUMMARY OF THE INVENTION

One object of the present invention is to provide a twin-cell, folded bitline memory layout in which crosstalk between adjacent bitlines has been essentially eliminated.

Another object of the present invention is to provide a twin-cell, folded bitline memory layout wherein the sense amplifiers can be laid-out at twice the pitch as compared to a conventional memory cell array. This is important since it creates more room for the sense amplifier drivers, which in turn, promotes a more efficient memory array.

A further object of the present invention is to provide a twin-cell, folded bitline layout which works at lower operating voltages than heretofore possible for conventional single- and twin-cell, folded bitline memory layouts.

These and other objects and advantages can be obtained in the present invention by combining a twin-cell, folded bitline layout with bitline shielding so that every other bitline of the array is sensed, while holding unselected bitlines of the array that are adjacent to the sensed bitlines at a constant predetermined voltage, i.e., potential, level.

Specifically, the present invention relates to a twin-cell, folded bitline memory array which comprises:

a plurality of bitlines arranged in one direction in parallel with each other, with every other bitline constituting a bitline pair;

a plurality of sense amplifiers being arranged in a line, wherein each sense amplifier is interconnected to two adjacent bitline pairs;

a plurality of wordlines arranged in a direction intersecting said plurality of bitlines, wherein a single wordline is coupled to every other bitline; and isolation means located on said plurality of bitlines, said isolation means being arranged such that when every other bitline of said plurality of bitlines is being sensed, the adjacent bitlines of said plurality of bitlines are held at a predetermined potential by a clamping means.

It is noted that the isolation means together with the clamping means employed in the present invention provides bitline shielding by sensing every other bitline, while holding the unselected bitlines at a predetermined potential level. In an embodiment of the present invention, the isolation means includes a first isolation transistor formed on every other bitline of the array and a second isolation transistor in a parallel arrangement with the first isolation transistor formed on the adjacent bitlines of the array which do not include the first isolation transistor.

The first and second isolation transistors include associated clamping means. The clamping means employed in the present invention serve both as precharging means and as a clamp. In accordance to the present invention, each isolation transistor includes clamping means arranged in such a manner which makes it possible to clamp an adjacent bitline that is not being sensed at a constant predetermined voltage level. Thus, permitting the sensing of every other bitline of the array, while holding, i.e., clamping, the unselected bitlines at a constant predetermined potential level.

In the present twin-cell, folded bitline memory design, half of the wordlines are coupled to a first pair of bitlines, and the other half are coupled to a second pair of bitlines. Moreover, in the inventive twin-cell, folded bitline only one wordline needs to be activated.

The present invention also is directed to a method of substantially eliminating bitline crosstalk in a twin-cell, folded bitline memory array. Specifically, the method of the present invention comprises:

(a) providing a twin-cell, folded bitline memory array which comprises a plurality of bitlines arranged in one direction in parallel with each other, with every other bitline constituting a bitline pair; a plurality of sense amplifiers being arranged in a line, wherein each sense amplifier is interconnected to two adjacent bitline pairs; a plurality of wordlines arranged in a direction intersecting said plurality of bitlines, wherein a single wordline is coupled to every other bitline; and isolation means located on said plurality of bitlines, said isolation means being arranged such that when every other bitline of said plurality of bitlines is being sensed, the adjacent bitlines of said plurality of bitlines are held at a predetermined potential by clamping means; and (b) switching on every other isolation means so as to activate every other bitline of said array, while holding other bitlines of said bitline pair not sensed at said predetermined voltage level with said clamping means.

DETAILED DESCRIPTION OF THE INVENTION

The present invention which provides a twin-cell, folded bitline memory architecture including bitline shielding will now be described in more detail by referring to FIG. 3. It should be noted that the twin-cell, folded bitline memory array shown in FIG. 3 is formed utilizing conventional DRAM and EBB processes well known to those skilled in the art.

Figure 1:
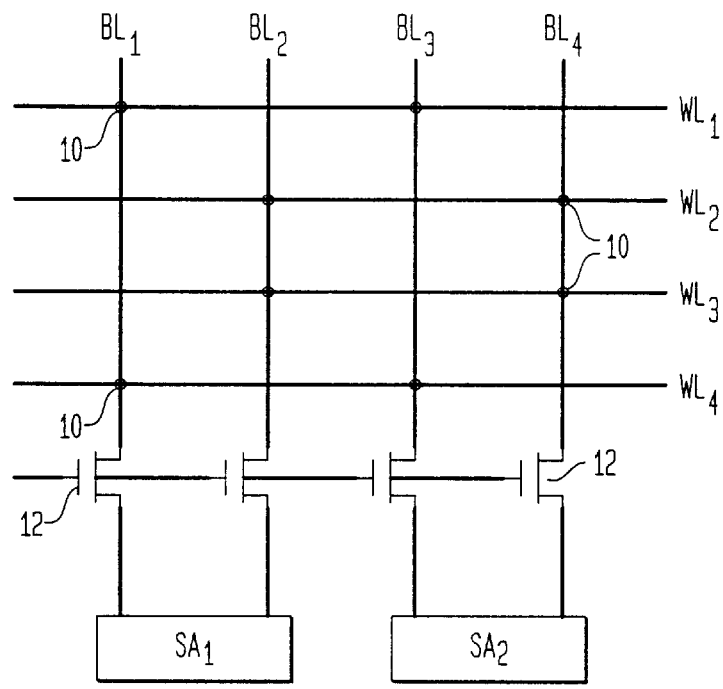
FIG. 1 is a schematic diagram showing a prior art single-cell, folded bitline memory layout.
Figure 2:
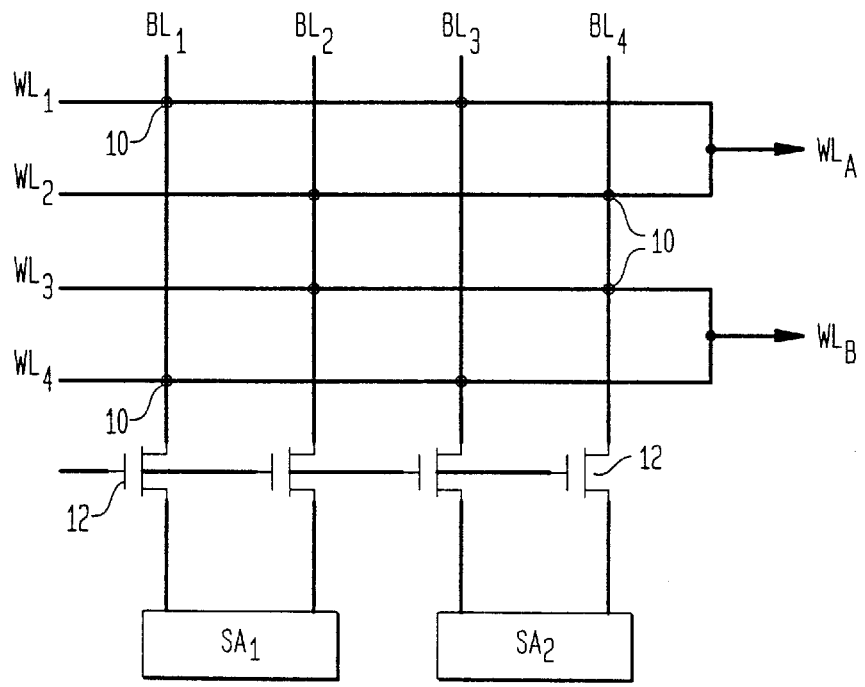
FIG. 2 is a schematic diagram showing a prior art twin-cell folded bitline memory layout.
Figure 3:
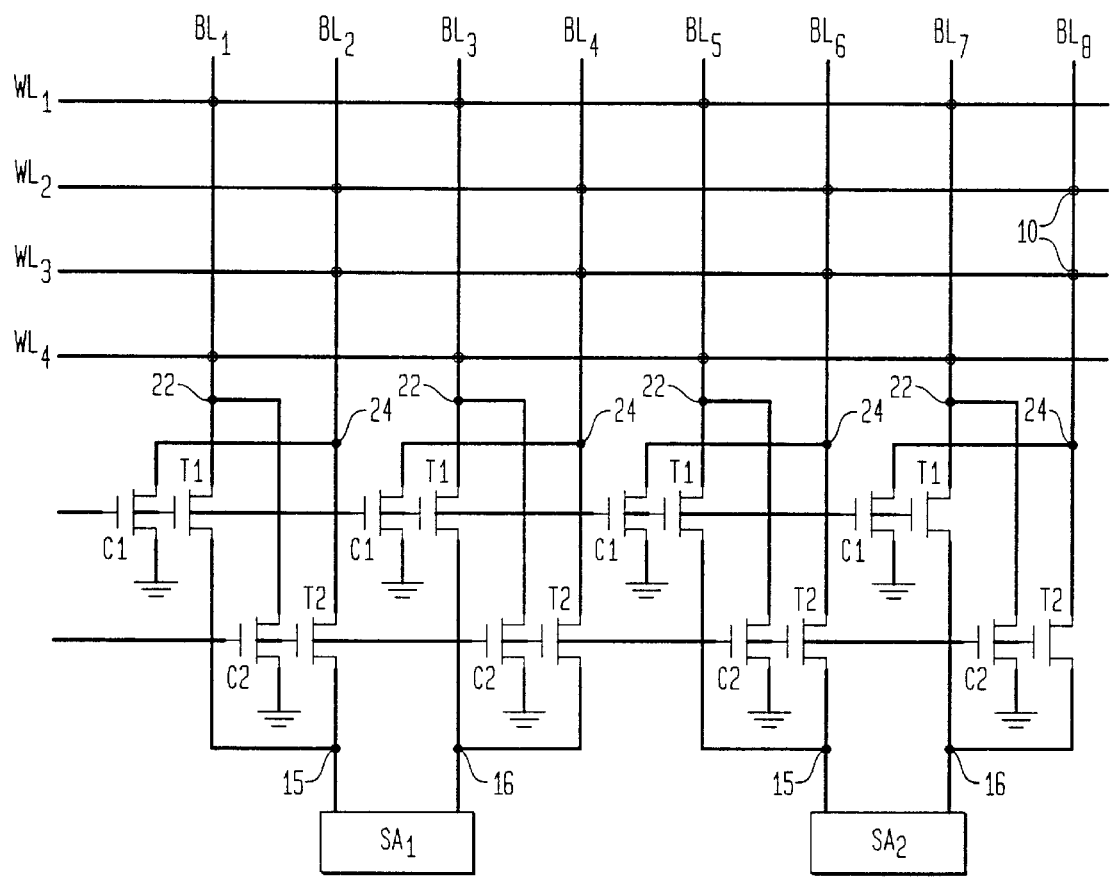
FIG. 3 is a schematic diagram showing the inventive twin-cell, folded bitline memory layout.

Specifically, FIG. 3 comprises a plurality of bitlines BL1, BL2, BL3, BL4, BL5, BL6, BL7, and BL8 arranged in one direction in parallel with each other. In accordance with FIG. 3, every other bitline, for example BL1 and BL3, constitutes a bitline pair which are electrically coupled together to a sense amplifier through point 15 or 16. It should be noted that the number of bitlines shown in FIG. 3 is exemplary and by no ways limits the scope of the present invention.

The schematic shown in FIG. 3 also includes a plurality of sense amplifiers, SA1 and SA2, which are arranged in a line. In the drawing, each sense amplifier, SA1, and SA2, for example, is interconnected to two adjacent bitline pairs such that four bitlines, e.g., BL1, BL2, BL3 and BL4, are associated with one sense amplifier, e.g., SA1. The number of sense amplifiers present in the array may vary provided that each sense amplifier has two bitline pairs, i.e., four bitlines, associated therewith.

The twin-cell, folded bitline layout of FIG. 3 further includes a plurality of wordlines, WL1, WL2, WL3, WL4, etc., arranged in a direction intersecting said plurality of bitlines. More importantly, in the inventive twin-cell, bitline memory layout, a single wordline is coupled to every other bitline, and only one wordline needs to be activated. For example, in FIG. 3, WL1 is coupled to BL1 and BL3 and BL5 and BL7, while WL2 is couple to BL2, BL4, BL6 and BL8. It is noted that reference numeral 10 denotes the memory cell of the twin-cell, folded bitline layout shown in FIG. 3. Thus, in the present twin-cell, folded bitline memory design shown in FIG. 3, half of the wordlines are coupled to a first pair of bitlines, and the other half are coupled to a second pair of bitlines.

Isolation and clamping means 20 are located on said plurality of bitlines, and are arranged such that when every other bitline of said plurality of bitline is being sensed by its corresponding sense amplifier, the adjacent bitlines of said plurality of bitlines not being sensed are held at a constant predetermined voltage level via clamping means.

It is noted that the isolation means employed in the present invention provide bitline shielding by sensing every other bitline, while holding via the clamping means the unselected bitlines at a predetermined voltage, i.e., potential, level. In the embodiment shown in FIG. 3, the isolation means include a first isolation transistor, T1, formed on every other bitline of the array and a second isolation transistor, T2, in a parallel arrangement with the first isolation transistor, formed on the adjacent bitlines not including T1. In one embodiment of the present invention the isolation transistors are n-type transistors.

Each isolation transistor shown in FIG. 3 includes clamping means C1 or C2. As shown, C1 is associated with T1 and C2 is associated with T2. Moreover, the clamping means, which may comprise a transistor, preferably n-type, are arranged such that when every other bitline of the array is being sensed the adjacent unselected bitlines of the array are held at a constant predetermined voltage level. Specifically, this objective is achieved by coupling C1 clamping means located on every other bitline to adjacent bitlines (reference numeral 24 denotes the point of coupling for this case) and by coupling C2 coupling means located on adjacent bitlines to every other bitline (reference numeral 22 denotes the point of coupling for this case). The arrangement shown in FIG. 3 not only provides clamping, but the clamping means can be used to precharge its corresponding bitline.

It is noted that the inventive twin-cell, folded bitline memory design includes benefits from both twin-cell folded bitlines and bitline shielding. That is, the inventive twin-cell, folded bitline design which senses every other bitline while shielding the adjacent bitlines next to the sensed bitlines at a predetermined potential by clamping means essentially eliminates bitline crosstalk. This essentially eliminated crosstalk is achieved since every selected bitline that is being sensed is surrounded by an unselected static voltage bitline which serves to completely shield selected bitlines from selected neighbors.

Moreover, in the inventive design, the twin-cell architecture is achieved with a single wordline coupled to every other bitline, a pair of which are coupled to a single sense amplifier. Furthermore, the inventive layout achieves identical orientation for both selected cells providing the best possible bitline matching, further reducing process and noise sensitivity. With only half the bitline activated, sense amplifier pitch requirements are cut in half improving area efficiency as well as increasing memory area layout density.

Figure 4:
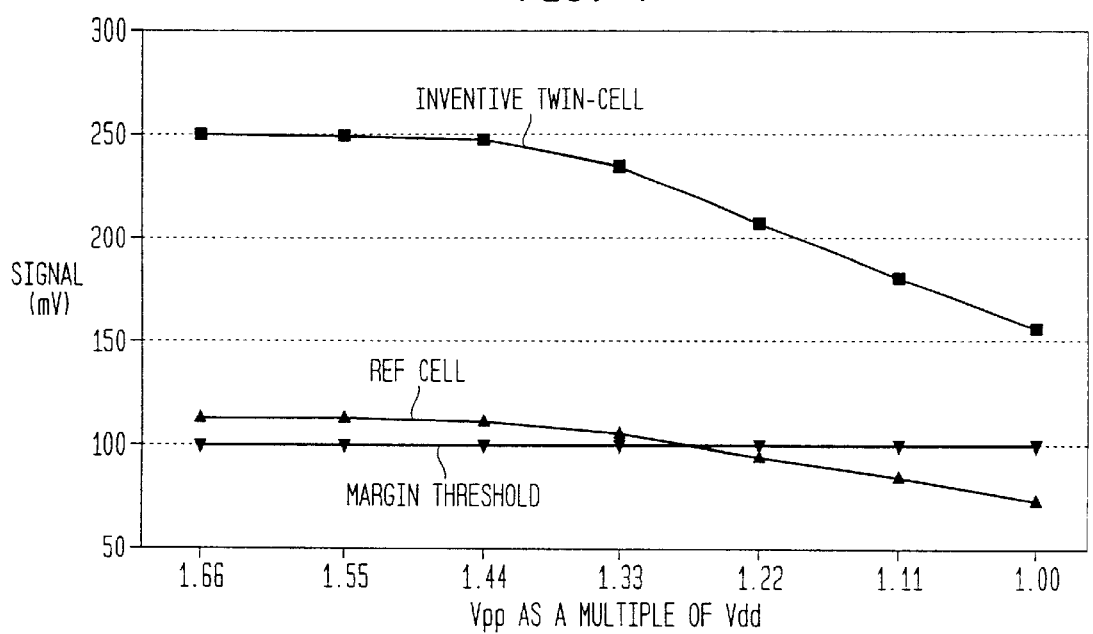
FIG. 4 is a graph of Signal (mV) vs. $V_{pp}$ for various memory cell layouts.

FIG. 4 quantifies the effectiveness of the inventive twin-cell with shielded bitline architecture by showing a single comparison between (i) a single standard folded bitline architecture array (Ref cell), and (ii) the inventive twin-cell folded bitline memory array. In this comparison the worst case data pattern of 3-adjacent sense amplifiers all sensing a "0" is used to illustrate the detrimental effects of Cll (line-to-line capacitance). As is shown in FIG. 4, the signal obtained from the inventive twin-cell, folded bitline memory array is more than twice that of a single cell with traditional bitline structure. All signal available from the transfer between cell to bitline is available for sensing. This more efficient array of the present invention allows an embedded-memory macro to run on non-boosted wordline and isolator levels, which is of great advantage in embedded memory applications. The inventive design, operating at $V_{pp}=V_{dd}$ has more signal than the single-cell traditional bitline array which is operated at $V_{pp}=1.66V_{dd}$.

The advantages of the inventive twin-cell, folded bitline architecture are thus as follow:

(1) Increased signal margin over a traditional twin-cell approach.

(2) Easier built-in testing or external testing because data pattern sensitivities are almost identical.

(3) Boosted array levels can be eliminated for increased reliability and density.

(4) Easier integration of memory into a logic technology.

While this invention has been particularly shown and described with respect to preferred embodiments thereof, it will be understood by those skilled in the art that the foregoing and other changes in forms and details may be made without departing from the spirit and scope of the present invention. It is therefore intended that the present invention not be limited to the exact forms and details described and illustrated, but fall within the scope of the appended claims.

Having thus described our invention in detail, what we claim is new and desire to secure by the Letters Patent is:

1. A twin-cell memory array which comprises:
   a plurality of bitlines arranged in one direction in parallel with each other, with every other bitline constituting a bitline pair;
   a plurality of sense amplifiers being arranged in a line, wherein each sense amplifier is interconnected to two adjacent bitline pairs;
   a plurality of wordlines arranged in a direction intersecting said plurality of bitlines, wherein a single wordline is coupled to every other bitline; and
   isolation means located on said plurality of bitlines, said isolation means being arranged such that when every other bitline of said plurality of bitlines is being sensed, the adjacent bitlines of said plurality of bitlines are held at a predetermined potential by a clamping means.

2. The twin-cell memory array of claim 1 wherein said isolation means are transistors.

3. The twin-cell memory array of claim 2 wherein said transistors comprise a first isolation transistor formed on every other bitline of said array and a second isolation transistor in a parallel arrangement with the first isolation transistor formed on the adjacent bitlines of the array.

4. The twin-cell memory array of claim 1 wherein half of the wordlines are coupled to a first pair of bitlines, and the other half are coupled to a second pair of bitlines.

5. The twin-cell memory array of claim 2 wherein said transistors are n-type transistors.

6. The twin-cell memory array of claim 1 wherein the predetermined potential is a constant voltage.

7. The twin-cell memory array of claim 1 wherein only one wordline is required to be activated.

8. The twin-cell memory array of claim 1 wherein said clamping means is capable of holding unselected bitlines at said predetermined potential and precharging said bitlines.

9. A method of substantially eliminating crosstalk in a twin-cell, folded bitline memory array comprising:

(a) providing a twin-cell, folded bitline memory array which includes a plurality of bitlines arranged in one direction in parallel with each other with every other bitline constituting a bitline pair; a plurality of sense amplifiers being arranged in a line, wherein each sense amplifier is interconnected to two adjacent bitline pairs; a plurality of wordlines arranged in a direction intersecting said plurality of bitlines, wherein a single wordline is coupled to every other bitline; and isolation means located on said plurality of bitlines, said isolation means being arranged such that when every other bitline of said plurality of bitlines is being sensed, the adjacent bitlines of said plurality of bitlines are held at a predetermined potential by a clamping means; and (b) switching on every other isolation means so as to activate every other bitline of said array, while holding other bitlines of said bitline pair not sensed at said predetermined voltage level with said clamping means.

* * * * *